(12) United States Patent
Ashida et al.

(10) Patent No.: US 12,463,100 B2
(45) Date of Patent: Nov. 4, 2025

(54) SEMICONDUCTOR MODULE

(71) Applicant: Hitachi Power Semiconductor Device, Ltd., Hitachi (JP)

(72) Inventors: Kisho Ashida, Tokyo (JP); Daisuke Kawase, Hitachi (JP); Koji Sasaki, Hitachi (JP)

(73) Assignee: HITACHI POWER SEMICONDUCTOR DEVICE, LTD., Ibaraki (JP)

( * ) Notice: Subject to any disclaimer, the term of this patent is extended or adjusted under 35 U.S.C. 154(b) by 275 days.

(21) Appl. No.: 18/254,412

(22) PCT Filed: Oct. 15, 2021

(86) PCT No.: PCT/JP2021/038246
§ 371 (c)(1),
(2) Date: May 25, 2023

(87) PCT Pub. No.: WO2022/190449
PCT Pub. Date: Sep. 15, 2022

(65) Prior Publication Data
US 2024/0006256 A1    Jan. 4, 2024

(30) Foreign Application Priority Data

Mar. 10, 2021   (JP) .................................. 2021-037996

(51) Int. Cl.
*H01L 23/053*  (2006.01)
*H01L 23/492*  (2006.01)

(52) U.S. Cl.
CPC ........ *H01L 23/053* (2013.01); *H01L 23/4924* (2013.01)

(58) Field of Classification Search
CPC .......................... H01L 23/053; H01L 23/4924
See application file for complete search history.

(56) References Cited

U.S. PATENT DOCUMENTS

| 5,621,243 A | * | 4/1997 | Baba | .................. | H01L 23/3736 |
| | | | | | 257/713 |
| 10,483,176 B2 | * | 11/2019 | Oya | ....................... | H01L 23/10 |

(Continued)

FOREIGN PATENT DOCUMENTS

| EP | 0828341 A2 | 3/1998 |
| JP | 2002-164503 A | 6/2002 |

(Continued)

OTHER PUBLICATIONS

International Search Report, mailed Dec. 28, 2021, for International Application No. PCT/JP2021/038246.

*Primary Examiner* — Eugene Lee
(74) *Attorney, Agent, or Firm* — Baker Botts L.L.P.

(57) ABSTRACT

Provided is a semiconductor module comprising a power semiconductor chip, a base, an insulating substrate bonded to the base, a semiconductor chip bonded to the insulating substrate, and a case adhered to the base by means of an adhesive. The semiconductor module has a low variability but a high assembly quality and reliability enabling a decrease in stress between the case and an adhered portion of the base. The base includes a plate-like first material, and a second material coating the first material and having a linear coefficient of expansion greater than that of the first material. The case covers at least part of a side surface of the base and is adhered to the base at least on an upper surface of the base by means of the adhesive, and a linear expansion coefficient of the case is larger than the linear expansion coefficient of the first material.

10 Claims, 12 Drawing Sheets

(56) References Cited

U.S. PATENT DOCUMENTS

| | | | |
|---|---|---|---|
| 2003/0146499 A1* | 8/2003 | Kondo | H01L 23/3733 |
| | | | 257/E23.112 |
| 2007/0246833 A1* | 10/2007 | Soga | H01L 23/24 |
| | | | 257/772 |
| 2011/0089568 A1 | 4/2011 | Nishibori et al. | |
| 2013/0062750 A1 | 3/2013 | Lenniger et al. | |
| 2013/0240909 A1* | 9/2013 | Hiramatsu | H01L 23/24 |
| | | | 257/77 |
| 2014/0035123 A1* | 2/2014 | Oka | H01L 23/49811 |
| | | | 438/122 |
| 2016/0307817 A1 | 10/2016 | Kimura et al. | |
| 2016/0365298 A1* | 12/2016 | Yamada | H01L 23/3114 |
| 2019/0103334 A1 | 4/2019 | Tanaka | |
| 2021/0366796 A1* | 11/2021 | Higashi | H01L 23/04 |
| 2022/0102227 A1* | 3/2022 | Cardi | H01L 23/40 |
| 2023/0124426 A1* | 4/2023 | Nakano | H01L 23/10 |
| | | | 257/787 |

FOREIGN PATENT DOCUMENTS

| | | |
|---|---|---|
| JP | 2011-086768 A | 4/2011 |
| JP | 2013-062506 A | 4/2013 |
| JP | 2016-207706 A | 12/2016 |
| JP | 2018-010989 A | 1/2018 |
| JP | 2019-067886 A | 4/2019 |
| JP | 2020-013866 A | 1/2020 |

\* cited by examiner

SEMICONDUCTOR MODULE

TECHNICAL FIELD

The present invention relates to a structure of a semiconductor module, and particularly relates to an effective technique applied to a mounting structure of a semiconductor module having a power semiconductor chip such as an IGBT.

BACKGROUND ART

In recent years, demand for a semiconductor module having a power semiconductor chip such as an insulated gate bipolar transistor (IGBT) has been expanding as a power control device mounted on a power generation system such as wind power generation, a railway, an electric vehicle, a hybrid vehicle, and the like, and development of a module structure capable of suppressing manufacturing variations and securing product quality has become increasingly important.

On the other hand, in the semiconductor module having the power semiconductor chip such as an IGBT, heat rises and falls depending on an operating condition to be used. Due to the rise and fall of the heat, the internal structure and the mounting structure of the semiconductor module are subjected to thermal stress, and fatigue and deterioration progress.

Therefore, as one of the reliability evaluation tests of the semiconductor module, a power cycle test (temperature cycle test) for evaluating a resistance to a change in electrical and thermal stress is performed by repeating ON/OFF.

In the power cycle test (temperature cycle test), large power is applied to the power semiconductor chip, and self-heating and cooling of the chip are repeated, thereby evaluating the resistance, to thermal stress, of members having different linear expansion coefficients. It is used for evaluation of bonding reliability at each interface of members such as a chip, a substrate, solder, and a bonding wire, and durability against distortion and cracks of a chip and a package resin.

As the background art of the present technical field, for example, there is a technique such as PTL 1. PTL 1 describes that "by making the thickness t1 of the resin portion of the side orthogonal to the long side direction L2 of the case thicker than the thickness t2 of the resin portion of the side orthogonal to the module short side direction L1 (L1<L2, t1>t2), it is possible to improve the accuracy as a component while suppressing the deformation as a module, and furthermore, it is possible to secure the adhesion area between the resin case 108 and the bottom metal substrate 205 and to prevent the occurrence of defective peeling between the resin case 108 and the bottom metal substrate 205 due to a temperature cycle or the like". (paragraph or the like of PTL 1)

In addition, PTL 2 describes that "the base plate 1 and the case 9 configure the container-shaped housing 10 for housing the insulation substrate 3 and the semiconductor chip 5, and the case 9 has a larger thickness in the Z direction than the bonding structure described above to be able to house the bonding structure of the base plate 1, the insulation substrate 3, and the semiconductor chip 5". (paragraph or the like of PTL 2)

CITATION LIST

Patent Literature

PTL 1: JP 2002-164503 A
PTL 2: JP 2018-10989 A

SUMMARY OF INVENTION

Technical Problem

Meanwhile, in the semiconductor module having a current power semiconductor chip, a mounting structure in which a ceramic insulation substrate on which the power semiconductor chip such as an IGBT is mounted is bonded onto a base by a substrate bonding solder, and a resin case is fixed to an upper surface of the base by an adhesive material and a fixing screw as described later is mainstream.

The resin case surrounds the power semiconductor chip and the insulation substrate, and the inside of the case is filled with silicone gel as a sealing material.

As the base, a metal material such as copper (Cu) or a silicon carbide-particle reinforced aluminum composite (AlSiC) is used.

Since AlSiC has a linear expansion coefficient as small as that of a ceramic insulation substrate, AlSiC is a material capable of reducing the load on the substrate bonding solder and is excellent in thermal conductivity, and thus AlSiC is often used as the base material of the semiconductor module having a power semiconductor chip.

When AlSiC is adopted as the material of the base, AlSiC is used in a state where an upper surface and a side surface of an AlSiC base material is generally covered with an aluminum (Al) film. The Al film covering AlSiC is used to secure workability and solder wettability of the base.

However, it has been seen that since the linear expansion coefficients of Al and the resin are larger than the linear expansion coefficient of AlSiC, stress may be generated at the time of temperature fluctuation of the power cycle test (temperature cycle test) or the like, and a crack may occur in the Al film covering AlSiC or AlSiC as the base material depending on an adhesion state such as variation in an adhesion position of the resin case adhering to the base.

Neither PTL 1 nor PTL 2 describes a problem of the crack due to the temperature fluctuation in the base using AlSiC as described above or a solution therefor.

In this regard, an object of the present invention is to provide a semiconductor module having a power semiconductor chip, the semiconductor module having high assembly quality and high reliability in which a variation in an adhesion position of a resin case adhering to a base is small, and stress between the case and a base adhesion portion can be reduced.

Solution to Problem

In order to solve the above problems, the present invention provides a semiconductor module including: a base; an insulation substrate bonded to the base; a semiconductor chip bonded to the insulation substrate; and a case adhering to the base with an adhesive material. The base includes a plate-shaped first material and a second material covering the first material and having a linear expansion coefficient larger than a linear expansion coefficient of the first material, In a case where the base is viewed in a plan view, the second material has first regions arranged at corner portions of the base and a second region arranged at an outer peripheral portion of the base and having a width narrower than a width of each of the first regions, the case covers at least a part of a side surface of the base and adheres to the base, with the adhesive material, at least on an upper surface of the base, and a linear expansion coefficient of the case is larger than the linear expansion coefficient of the first material, when a length from a center of a side of the base to an end portion of the base is L1, and a length from the center of the side of the base to a boundary between the first region and the second region is L2, L1−L2 is larger than a plate thickness of the base, and L3≥L2 or L2−L3≥L1−L2 is satisfied in a case where a length from the center of the side of the base to an end portion on a corner portion side of the base of the adhesive material which adheres the case to the base on the side surface of the base is L3, and L3=0 in a case where there is no adhesive material on the side surface of the base.

Advantageous Effects of Invention

According to the present invention, in the semiconductor module having a power semiconductor chip, it is possible to realize the semiconductor module having high assembly quality and high reliability in which a variation in an adhesion position of a resin case adhering to a base is small, and stress between the case and a base adhesion portion can be reduced.

Problems, configurations, and effects other than those described above will be clarified by the following description of embodiments.

DESCRIPTION OF EMBODIMENTS

Figure 1:
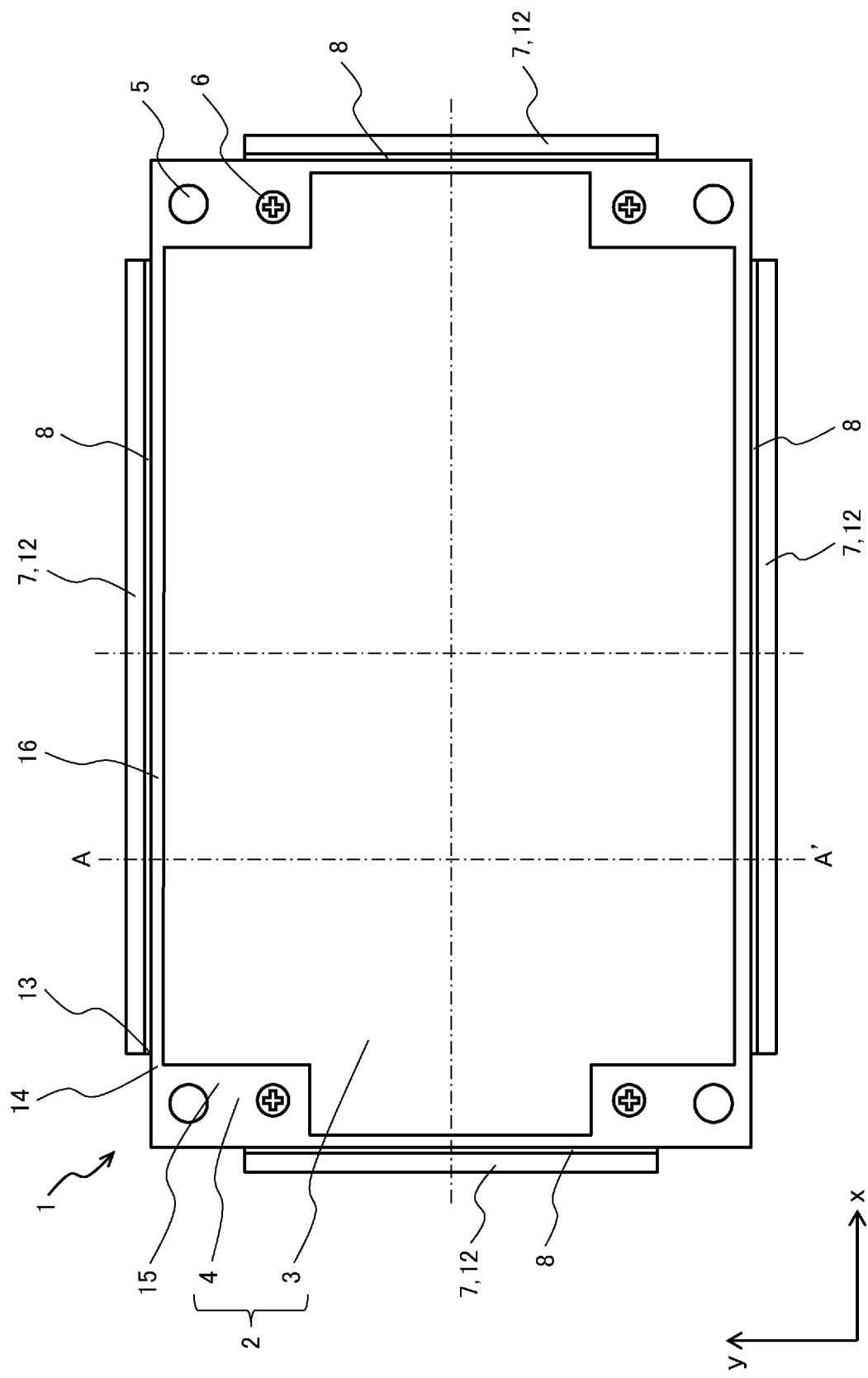
FIG. 1 is a bottom view of a semiconductor module illustrated as a comparative example of the present invention.

Embodiments of the present invention will be described below with reference to the drawings. Note that in the drawings, the same components are denoted by the same reference signs, and the detailed description of redundant components is omitted.

First Embodiment

Figure 2:
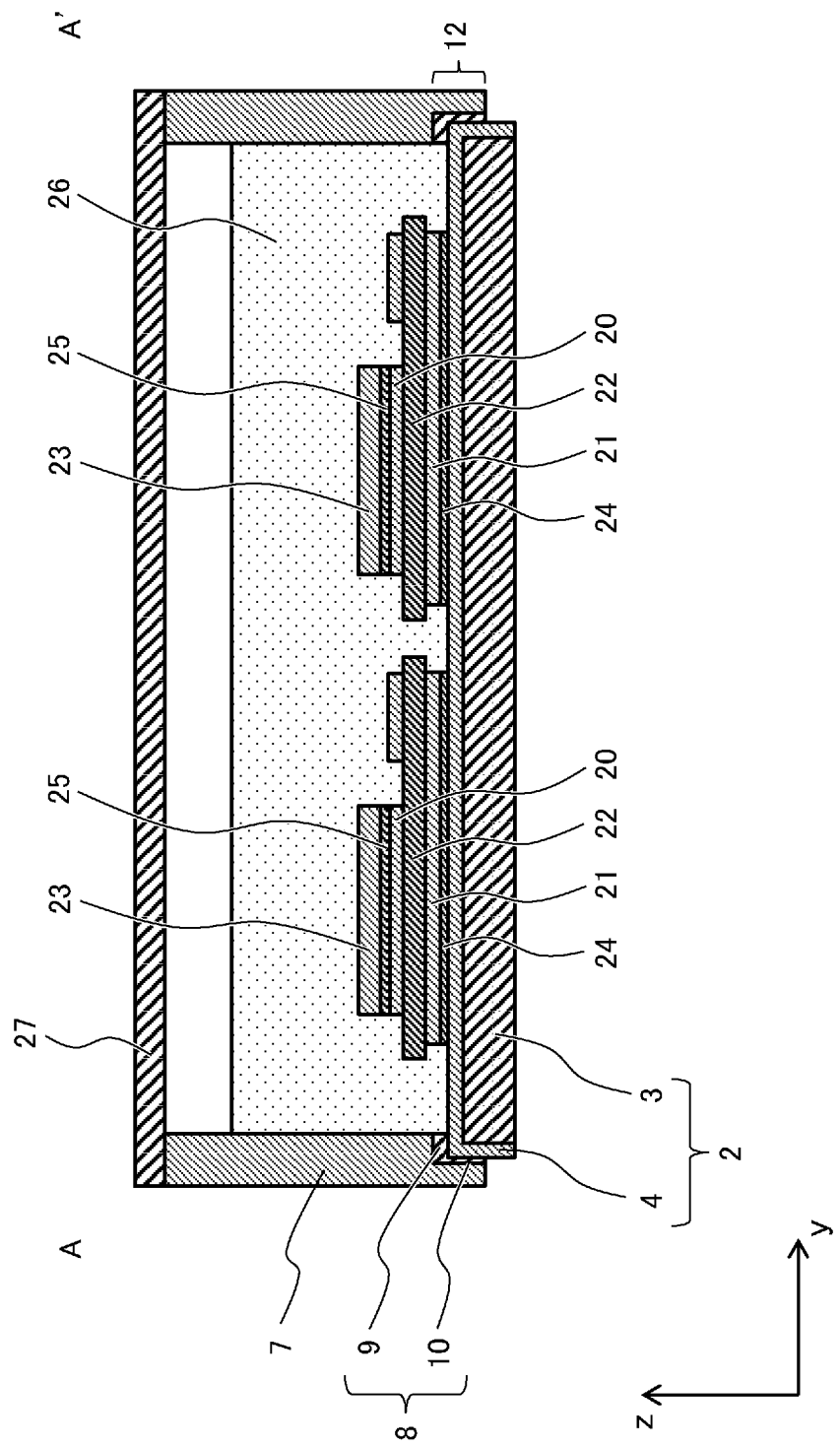
FIG. 2 is a cross-sectional view taken along line A-A' of FIG. 1.
Figure 3:
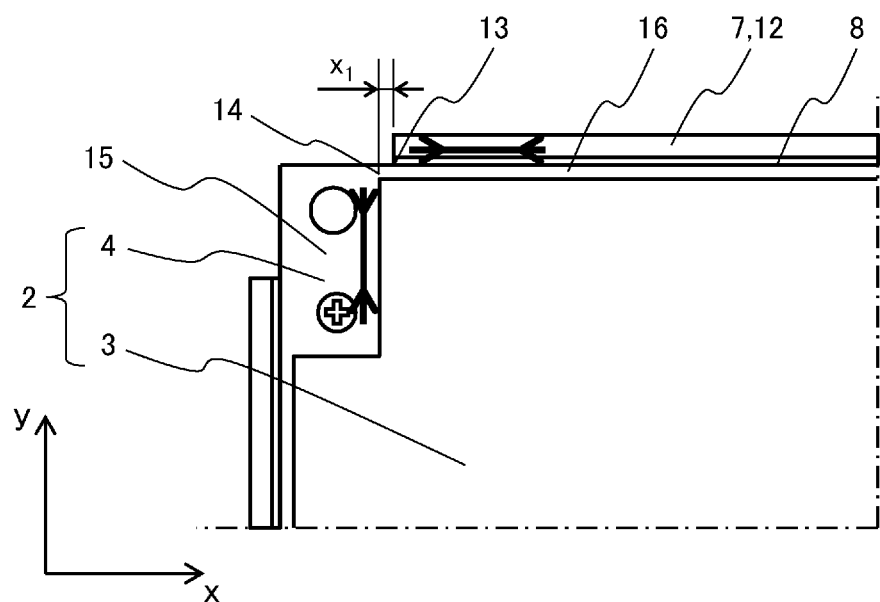
FIG. 3 is a view conceptually illustrating stress on a base side surface of the semiconductor module in FIG. 1.

First, a basic structure of a semiconductor module to be an object of the present invention and a problem thereof will be described with reference to FIGS. 1 to 3. FIG. 1 is a bottom view of the semiconductor module illustrated as a comparative example of the present invention, and FIG. 2 is a cross-sectional view taken along line A-A' of FIG. 1. FIG. 3 is a view conceptually illustrating stress generated on a base side surface of the semiconductor module in FIG. 1.

Details of each component of the semiconductor module will be described in detail in the description of the embodiment of the present invention. In addition, the configuration described here is common to each embodiment of the present invention except for the configuration related to the problem. A configuration different from the configuration described herein will be described in each embodiment.

As illustrated in FIGS. 1 and 2, in a semiconductor module 1, a ceramic insulation substrate 22 in which a circuit wiring pattern 20 and a lower surface conductor layer 21 are formed is bonded onto a plate-shaped base 2 made of a metal material such as copper (Cu) or a silicon carbide particle-reinforced aluminum composite (AlSiC) by a substrate bonding solder 24, and a semiconductor chip 23 is bonded onto the circuit wiring pattern 20 by a chip bonding solder 25.

Although not illustrated, the semiconductor module 1 is provided with a terminal and a metal wire for electrical connection with the outside.

A case 7 made of resin such as polybutylene terephtalate (PBT) or polyphenylene sulfide (PPS) is fixed to the upper surface of the base 2 with an adhesive material 8 and a fixing screw 6. The base 2 is provided with a fixing pit 5 for fixing the semiconductor module 1 to a heat dissipation fin (not illustrated). The case 7 surrounds the insulation substrate 22 on which the semiconductor chip 23 is mounted, and the inside of the case 7 is filled with a silicone gel 26. Furthermore, a lid 27 made of resin is provided on the upper surface of the case 7. The semiconductor chip 23 is protected by sealing with the silicone gel 26 and the lid 27.

Herein, in a case where the adhesion position of the case 7 to the base 2 is displaced, the sealing with the silicone gel 26 may be incomplete, and thus it is important to secure the adhesion positioning accuracy of the case 7. Therefore, a case protruding portion 12 is provided on the lower surface side of four sides of the case 7, and in a process of adhesion of the case 7 to the base 2, the case protruding portion 12 is installed to face the side surfaces of four sides of the base 2, thereby securing the adhesion positioning accuracy of the case 7. Therefore, as illustrated in FIG. 2, the case 7 is caused to adhere to the upper surface and the side surface of the base 2 by an adhesive material upper surface portion 9 and an adhesive material side surface portion 10 of the adhesive material 8.

The above-described technical problem will be described in detail by using the above-described comparative example.

It is assumed that a silicon carbide particle-reinforced aluminum composite (AlSiC) is used as the material of the base 2. As illustrated in FIGS. 1 and 2, the base 2 is made of two types of materials of an AlSiC material 3 and an Al material 4 covering the upper surface and the side surface of the AlSiC material 3.

Since the linear expansion coefficient of AlSiC is as small as the linear expansion coefficient of the insulation substrate 22, AlSiC is a material capable of reducing the load on the substrate bonding solder 24. Furthermore, since AlSiC is excellent in thermal conductivity, AlSiC is often used as a base material of a semiconductor module having a power semiconductor chip. The Al material 4 covering the AlSiC material 3 is used to secure workability and solder wettability of the base 2. In addition, the linear expansion coefficient of the Al material 4 is larger than the linear expansion coefficient of the AlSiC material 3.

Herein, the inventors of the present application have found that in a case where an adhesion end portion 13 between the case 7 and the side surface of the base 2 is positioned on a narrow region 16 side in the vicinity of a boundary 14 where the dimension of the Al material 4 in a y direction changes from a wide region 15 to the narrow region 16, stress generated on the side surface of the base 2 may increase when the temperature of the semiconductor module 1 changes from a high temperature to a low temperature.

FIG. 3 is a schematic diagram illustrating a mechanism in which stress increases. A ¼ model of the semiconductor module 1 is illustrated in consideration of symmetry. For example, focusing on the long side of the long side or the short side, in a case where the temperature of the semiconductor module 1 changes from a high temperature to a low temperature, in a wide region (first region) 15 of the Al material 4 in which the width of the Al material 4 (a length in the y direction when focusing on the long side) is wide, the Al material 4 having a large linear expansion coefficient contracts as indicated by an arrow in the drawing. In addition, the case 7 adhering to the side surface of the base 2 and having a large linear expansion coefficient also contracts. It is considered that the contraction of both members increases the x-direction stress generated on the Al material surface of the adhesion end portion 13, that is, the narrow region (second region) 16 of the Al material 4.

In order to verify this mechanism, thermal stress analysis was performed on a semiconductor module. An analysis model was a ¼ model illustrated in FIG. 3, and a temperature condition was a condition for lowering the temperature from the high temperature=125° C. to the low temperature=−40° C. Two cases of the presence or absence of adhesion between the side surface of the base 2 and the case 7 were analyzed, and the stress generated in the Al material covered on the side surface of the base 2 was compared and evaluated. A case was assumed in which in the position of the adhesion end portion 13, a distance $x_1$ illustrated in FIG. 3 was 1 mm.

As a result, it was confirmed that the stress generated in the Al material was the maximum value at the adhesion end portion 13 in the case of side surface adhesion. In addition, it was confirmed that the maximum stress value in the case of side surface adhesion increased about 1.4 times as compared with the case of no side surface adhesion. From this analysis result, it is considered that the mechanism in which the stress illustrated in FIG. 3 increases is appropriate.

Therefore, it can be seen that stress may be generated at the time of temperature fluctuation of the power cycle test (temperature cycle test), and a crack may occur in the Al material 4 covering the AlSiC material 3 due to the increase in stress depending on an adhesion state such as a variation in the adhesion position of the resin case 7 adhering to the base 2.

Figure 4:
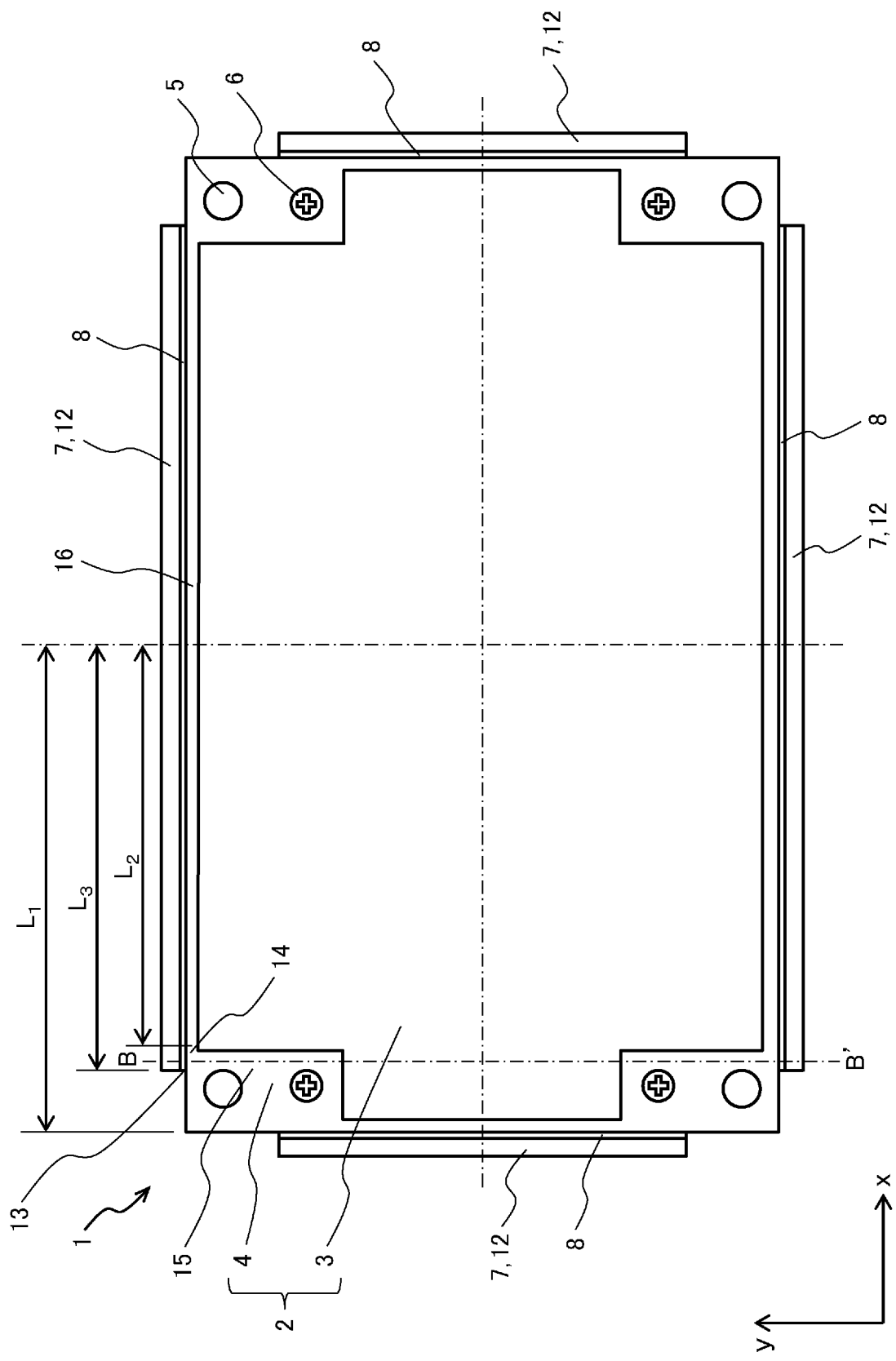
FIG. 4 is a bottom view of the semiconductor module according to a first embodiment of the present invention.
Figure 5:
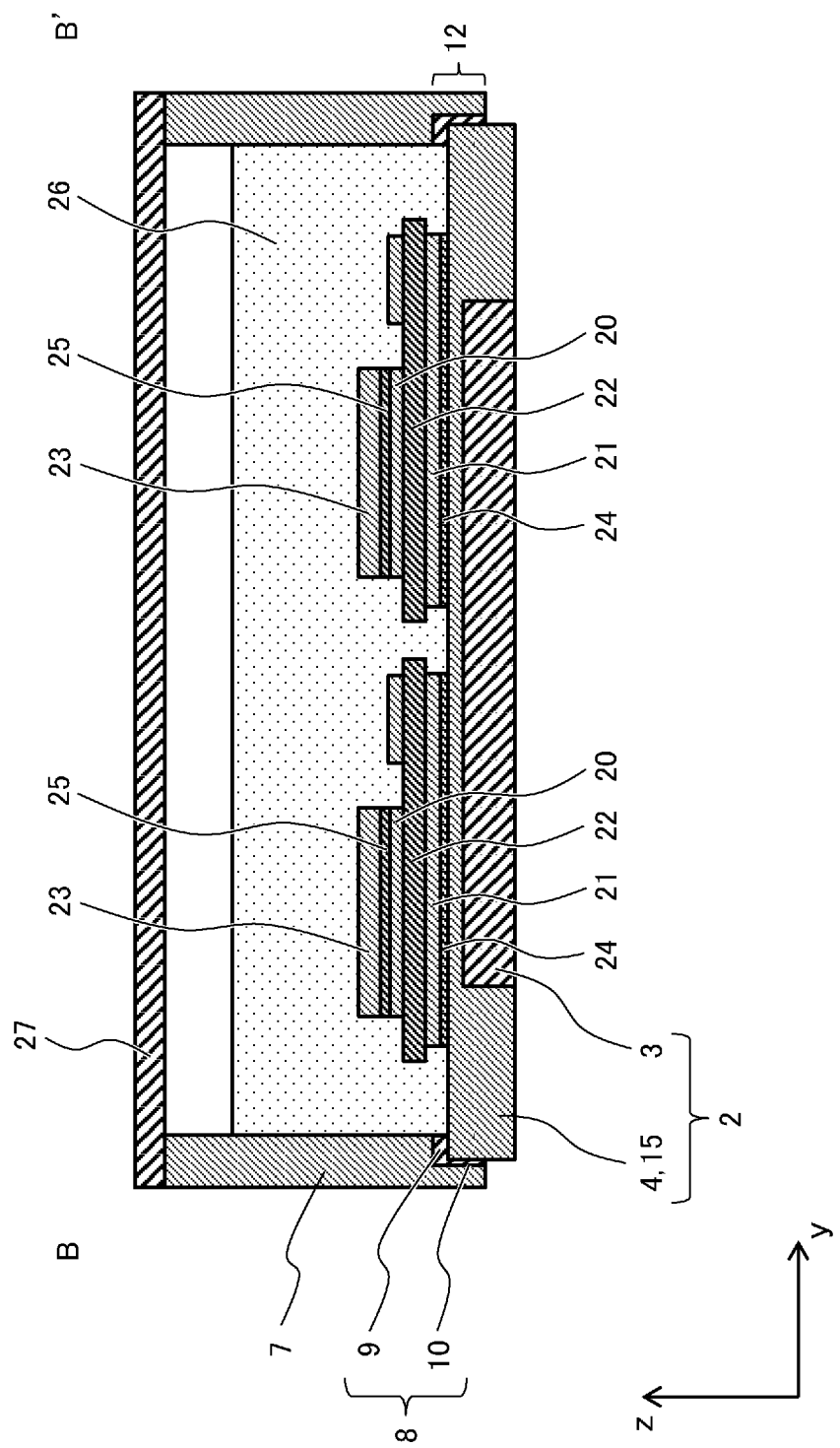
FIG. 5 is a cross-sectional view taken along line B-B' of FIG. 4.

Next, a semiconductor module according to a first embodiment of the present invention will be described with reference to FIGS. 4 and 5. FIG. 4 is a bottom view of the semiconductor module of the present embodiment, and FIG. 5 is a cross-sectional view taken along line B-B' of FIG. 4. FIGS. 4 and 5 correspond to FIGS. 1 and 2 of the above-described comparative example, respectively.

As illustrated in FIGS. 4 and 5, in the semiconductor module 1 of the present embodiment, the ceramic insulation substrate 22 in which the circuit wiring pattern 20 and the lower surface conductor layer 21 are formed is bonded onto the plate-shaped base 2 made of the AlSiC material 3 and the Al material 4 by the substrate bonding solder 24, and the semiconductor chip 23 is bonded onto the circuit wiring pattern 20 by the chip bonding solder 25.

Although not illustrated, the semiconductor module 1 is provided with a terminal and a metal wire for electrical connection with the outside.

The case 7 made of resin such as PBT or PPS is fixed to the upper surface of the base 2 with the adhesive material 8 and the fixing screw 6. The base 2 is provided with a fixing pit 5 for fixing the semiconductor module 1 to a heat dissipation fin (not illustrated). The case 7 surrounds the insulation substrate 22 on which the semiconductor chip 23 is mounted, and the inside of the case 7 is filled with a silicone gel 26. Furthermore, a lid 27 made of resin is provided on the upper surface of the case 7. The semiconductor chip 23 is protected by sealing with the silicone gel 26 and the lid 27.

The case protruding portion 12 is provided on the lower surface side of the four sides of the case 7. The case protruding portion 12 faces the side surface of the base 2 and is provided to cover at least a part of the side surface of the base 2. This is because, in the process of adhesion of the case 7 to the base 2, the case protruding portion 12 is installed to face the side surfaces of the four sides of the base 2, and the adhesion positioning accuracy of the case 7 is secured. As illustrated in FIG. 5, the case 7 is caused to adhere to the upper surface and the side surface of the base 2 by the adhesive material upper surface portion 9 and the adhesive material side surface portion 10 of the adhesive material 8.

The base 2 will be described in detail. As illustrated in FIGS. 4 and 5, the base 2 is made of two types of materials of the AlSiC material 3 and the Al material 4 covering at least the upper surface and side surface of the AlSiC material 3. Since the linear expansion coefficient of AlSiC is as small as the linear expansion coefficient of the insulation substrate 22, AlSiC is a material capable of reducing the load on the substrate bonding solder 24. Furthermore, since AlSiC is excellent in thermal conductivity, AlSiC is often used as a base material of a semiconductor module having a power semiconductor chip.

The Al film covering AlSiC is used to secure workability and solder wettability of the base. In addition, the linear expansion coefficient of Al is larger than the linear expansion coefficient of AlSiC.

For example, focusing on the long side of the long side or the short side, in a case where the base 2 is viewed in a plan view, the Al material 4 includes the wide regions (first regions) 15 of the Al material 4 arranged at the corner portions of the base 2 and the narrow region (second region) 16 of the Al material 4 arranged at the outer peripheral portion of the base 2 and having a smaller width (a length in the y direction when focusing on the long side) than the wide region (first region) 15 of the Al material 4. Since it is necessary to process a fixing pit 5 for fixing the base 2 to the heat dissipation fin (not illustrated) and a pit for fixing the case 7 with the fixing screw 6 at the corner portion of the base 2, the Al material 4 which is a material excellent in workability is used.

Next, the adhesion region between the side surface of the base 2 and the case 7 will be described in detail. The case 7 covers at least a part of the side surface of the base 2, and is caused to adhere to the base 2 via the adhesive material 8 at least on the upper surface of the base 2.

In the semiconductor module 1 of the present embodiment, as illustrated in FIG. 4, the position of the adhesion end portion 13 of the base 2 and the case 7 is defined by using a length (L1) from the center of the side of the base 2 to the end portion of the base 2, a length (L2) from the center of the side of the base 2 to the boundary between the first region 15 and the second region 16, a length (L3) from the center of the side of the base 2 to the end portion of the adhesive material 8 (more specifically, the adhesive material side surface portion 10) which adheres the base 2 and the case 7 on the side surface of the base 2, and the plate thickness of the base 2.

In the present embodiment, the wide region (first region) 15 of the Al material 4 is provided such that a difference (L1−L2) between L1 and L2, that is, an x-direction length of the wide region (first region) 15 of the Al material 4 is larger than the plate thickness of the base 2. In addition, the position of the adhesion end portion 13 is defined such that L3 is equal to or larger than L2 (L3≥L2).

Herein, as described above, a case where the temperature of the semiconductor module 1 changes from a high temperature to a low temperature is considered. In a case where the temperature of the semiconductor module 1 changes from a high temperature to a low temperature, the case 7 adhering to the side surface of the base 2 and having a large linear expansion coefficient contracts in the x direction. However, since the adhesion end portion 13 is positioned in the wide region (first region) 15 of the Al material 4, the width (the length in the y direction when focusing on the long side) of the Al material 4 is wide, and the rigidity is large, so that the deformation of the Al material 4 at the adhesion end portion 13 due to the contraction of the case 7 is small, and the generated stress is also suppressed.

In order to confirm this effect, thermal stress analysis was performed on the semiconductor module 1 of the present embodiment, similarly to the examination in the comparative example described above. The analysis model, the load condition, and the like were set to the same conditions as in the comparative example, and the position of the adhesion end portion 13 was set to a position of L3−L2=1 mm.

As a result, the maximum stress value with the side surface adhesion was almost equal to that without the side surface adhesion. Therefore, in the present embodiment satisfying the condition of L3≥L2, it is possible to suppress the stress generated in the base 2 (the AlSiC material 3 and the Al material 4) at the adhesion end portion 13 and to improve the structural reliability.

In the present embodiment, the relationship between the dimensions of the base 2, the case 7, and the adhesion portion and the effects thereof have been described for the adhesion region on the long side (the x direction side in FIG. 4) of the semiconductor module 1. However, a similar dimensional relationship and an effect relationship thereof are also established on the short side (the y direction side in FIG. 4) of the semiconductor module 1.

Second Embodiment

Figure 6:
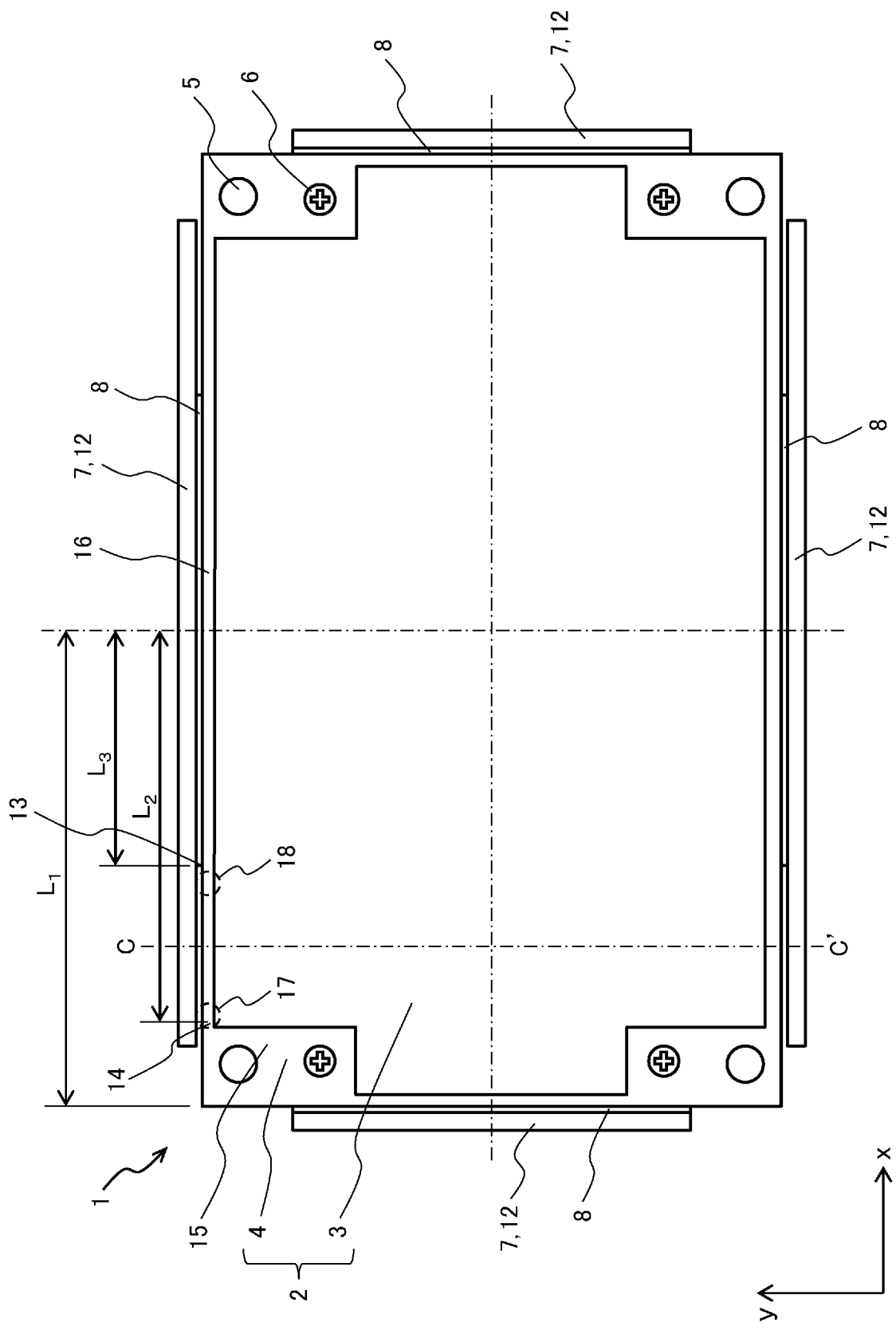
FIG. 6 is a bottom view of the semiconductor module according to a second embodiment of the present invention.
Figure 7:
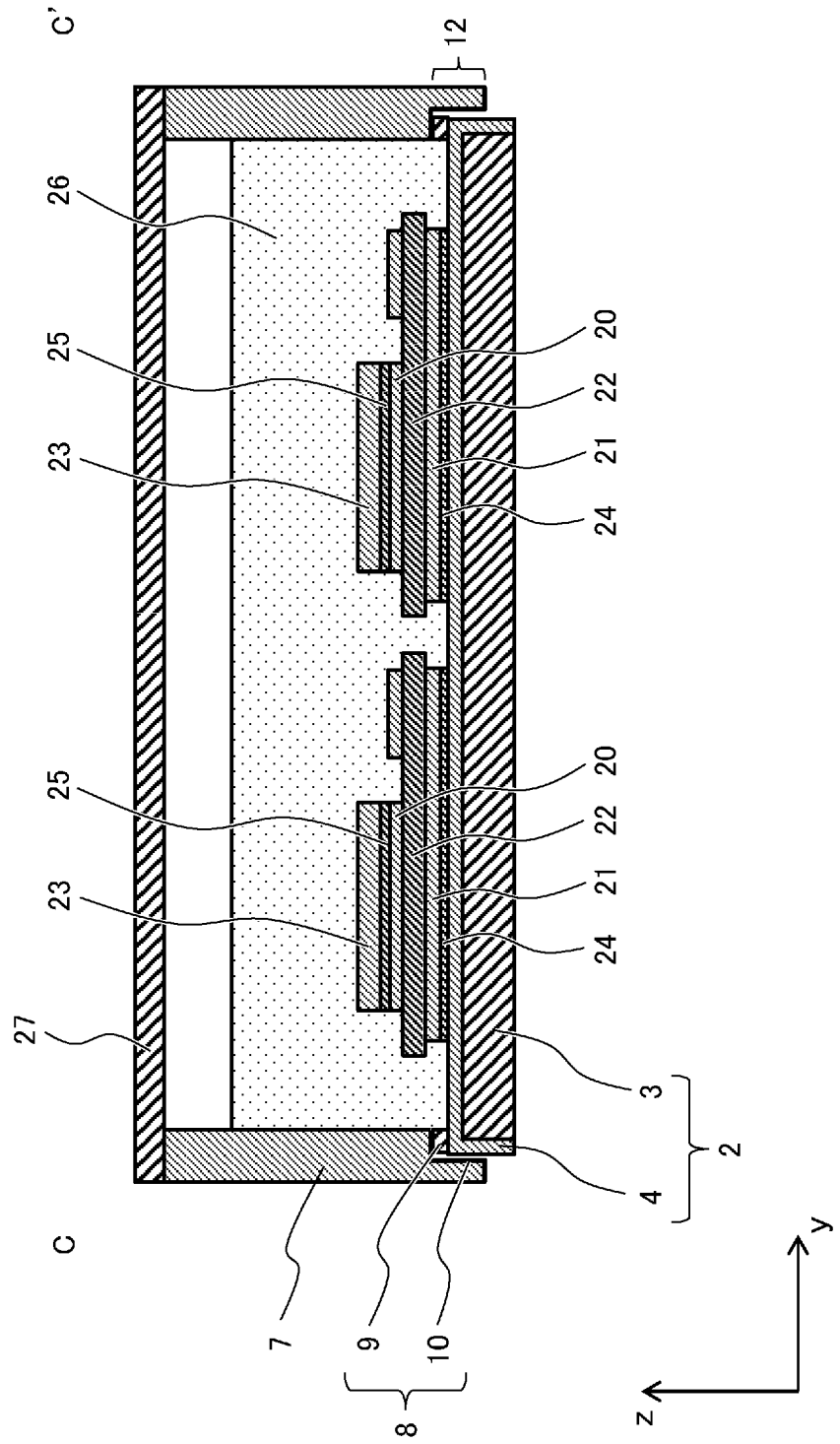
FIG. 7 is a cross-sectional view taken along line C-C' of FIG. 6.
Figure 8:
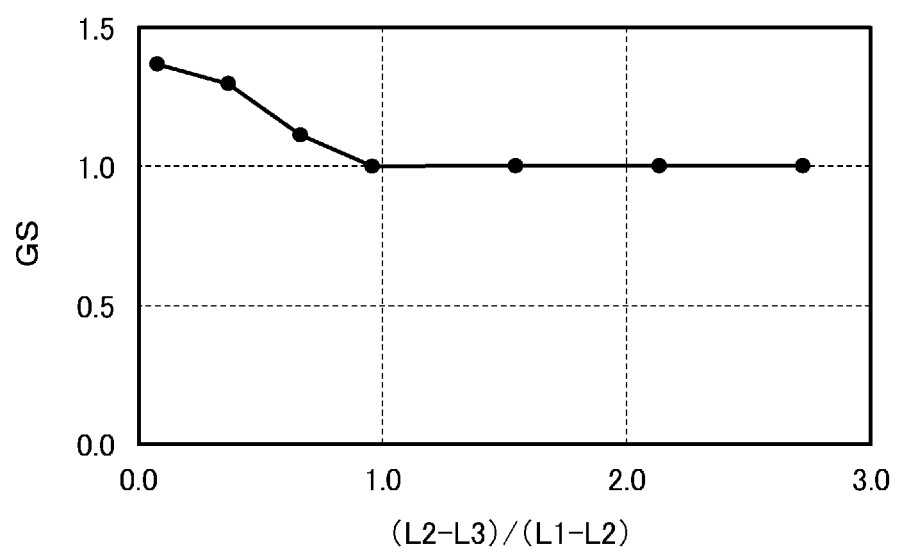
FIG. 8 is a diagram illustrating a relationship between an adhesion region and a generated stress (GS) in the semiconductor module of FIG. 6.
Figure 9:
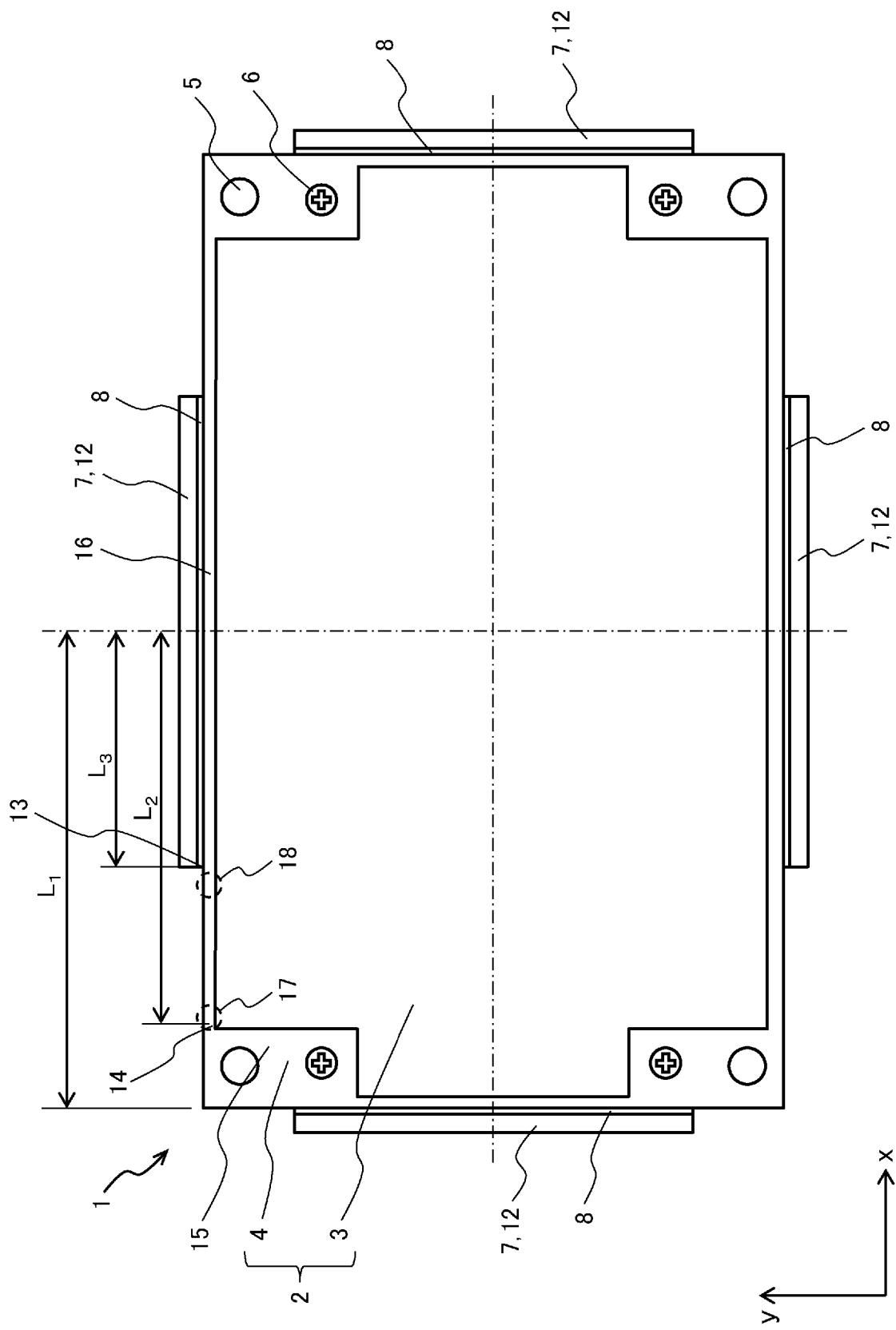
FIG. 9 is a view illustrating a modification of FIG. 6.

A semiconductor module according to a second embodiment of the present invention will be described with reference to FIGS. 6 to 9. FIG. 6 is a bottom view of the semiconductor module of the present embodiment, and FIG. 7 is a cross-sectional view taken along line C-C' of FIG. 6. FIGS. 6 and 7 correspond to FIGS. 4 and 5 of the first embodiment, respectively. FIG. 8 is a diagram illustrating a relationship between an adhesion region and a generated stress (GS) in the semiconductor module of FIG. 6. Note that FIG. 9 is a modification of FIG. 6.

A basic configuration of the present embodiment is similar to that of the first embodiment, and points different from the first embodiment will be mainly described.

In the semiconductor module 1 of the present embodiment, as illustrated in FIG. 6, the positions of the side surface of the base 2 and the adhesion end portion 13 of the case 7 are defined by using the length (L1) from the center of the side of the base 2 to the end portion of the base 2, the length (L2) from the center of the side of the base 2 to the boundary between the first region 15 and the second region 16, the length (L3) from the center of the side of the base 2 to the end portion of the adhesive material 8 which adheres the base 2 and the case 7 on the side surface of the base 2, and the plate thickness of the base 2.

In the present embodiment, the wide region (first region) 15 of the Al material 4 is provided such that a difference (L1−L2) between L1 and L2, that is, an x-direction length of the wide region (first region) 15 of the Al material 4 is larger than the plate thickness of the base 2. In addition, the position of the adhesion end portion 13 is defined such that a difference (L2−L3) between L2 and L3 is equal to or larger than the difference (L1−L2) between L1 and L2 (L2−L3≥L1−L2).

The length L3 of the adhesion portion is shorter than the length of the case 7, but this can be realized by controlling the application amount and the application position of the adhesive material 8 in the case adhesion process.

Herein, as described above, a case where the temperature of the semiconductor module 1 changes from a high temperature to a low temperature is considered. In a case where the temperature of the semiconductor module 1 changes from a high temperature to a low temperature, the Al material 4 having a large linear expansion coefficient contracts in the x direction in the region 15 where the width of the Al material 4 (the length in the y direction when focusing on the long side) is wide. Therefore, this contraction generates a stress which pulls a region 17 of a rounded portion on the side surface of the base 2 in the x direction. In addition, the case 7 adhering to the side surface of the base 2 and having a large linear expansion coefficient contracts in the x direction. Therefore, a stress which pulls a region 18 of a rounded portion on the side surface of the base 2 in the x direction is generated.

However, in the case of the present embodiment, since the two regions 17 and 18 are sufficiently separated, the generated stress is not superimposed, and the stress generated on the surface of the Al material 4 on the side surface of the base 2 can be suppressed.

In order to confirm this effect, thermal stress analysis was performed on the semiconductor module 1 of the present embodiment, similarly to the examination in the comparative example described above. The analysis model, the load condition, and the like were set to the same conditions as in the comparative example, and L2−L3 indicating the position of the adhesion end portion 13 was used as a parameter.

FIG. 8 illustrates an analysis result. The horizontal axis of the graph represents the value of (L2−L3)/(L1−L2), and the vertical axis represents the value obtained by normalizing the maximum stress value generated on the surface of the Al material 4 on the side surface of the base 2 with the maximum stress value on the side surface of the base 2 in the case of no side surface adhesion.

As illustrated in FIG. 8, in a case where (L2−L3)/(L1−L2) was 1 or more, the maximum stress value with side surface adhesion was almost the same (relative value was 1.0) as that without side surface adhesion. Similar results were obtained in a case where L1-L2 was examined with different values.

Therefore, in the present embodiment satisfying the condition of L2-L3≥L1-L2, it is possible to suppress the stress generated in the base 2 (the AlSiC material 3 and the Al material 4) of the adhesion end portion 13 and to improve the structural reliability.

Also in the present embodiment, the relationship between the dimensions of the base 2, the case 7, and the adhesion portion and the effects thereof have been described for the adhesion region on the long side (the x direction side in FIG. 4) of the semiconductor module 1. However, a similar dimensional relationship and an effect relationship thereof are also established on the short side (the y direction side in FIG. 4) of the semiconductor module 1.

In the present embodiment, since the length L3 of the adhesion portion is shorter than L2, the length of the case 7 in FIG. 6 is assumed to be longer than the length L3 of the adhesion portion. However, since the adhesive material 8 is easily wetted and spread, a structure is also conceivable in which the length of the case 7 is the same as the desired length L3 of the adhesion portion as in the modification illustrated in FIG. 9. In FIG. 9, the length from the center of the side of the base 2 to the end portion of the case 7 facing the side surface of the base 2 is configured to be the same as L3.

However, also in the case of the configuration as illustrated in FIG. 9, it is necessary to define the position of the adhesion end portion 13 such that the difference (L2-L3) between L2 and L3 is equal to or larger than the difference (L1-L2) between L1 and L2 (L2-L3 L1-L2).

Third Embodiment

Figure 10:
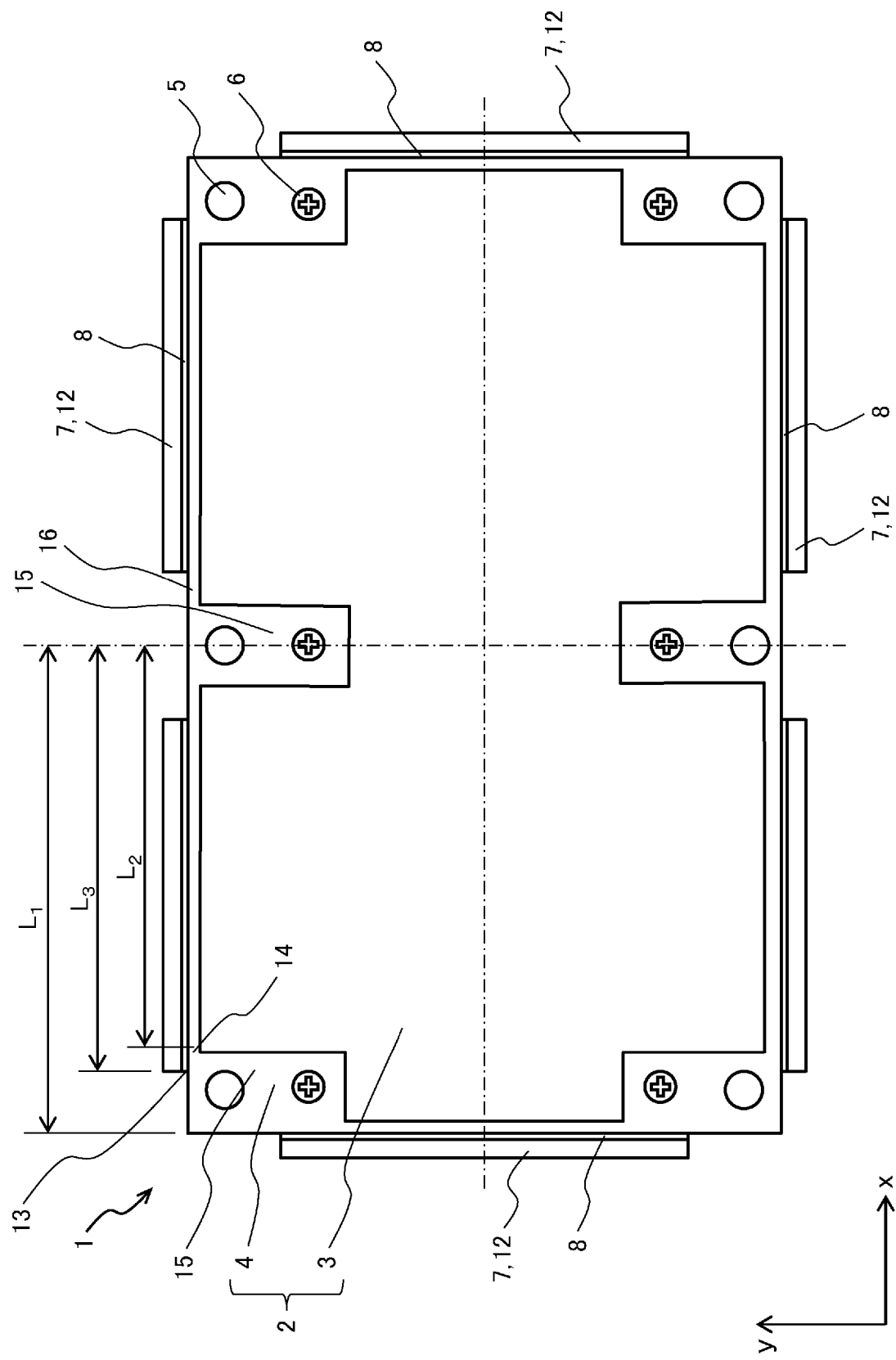
FIG. 10 is a bottom view of a semiconductor module according to a third embodiment of the present invention.

A semiconductor module according to a third embodiment of the present invention will be described with reference to FIG. 10. FIG. 10 is a bottom view of the semiconductor module of the present embodiment, and corresponds to FIG. 4 of the first embodiment.

A basic configuration of the present embodiment is similar to that of the first embodiment, and points different from the first embodiment will be mainly described.

In the semiconductor module 1 of the present embodiment, as illustrated in FIG. 10, in a case where the base 2 is viewed in a plan view, the Al material 4 includes the first regions 15 arranged at the corner portions of the base 2 and the central portion of the base 2 in a longitudinal direction, and the second region 16 arranged in the outer peripheral portion of the base 2 and having a width narrower than that of the first region 15.

The positions of the side surface of the base 2 and the adhesion end portion 13 of the case 7 are defined by using the length (L1) from the center of the side of the base 2 to the end portion of the base 2, the length (L2) from the center of the side of the base 2 to the boundary between the first region 15 and the second region 16, the length (L3) from the center of the side of the base 2 to the end portion of the adhesive material 8 which adheres the base 2 and the case 7 on the side surface of the base 2, and the plate thickness of the base 2.

In a case where the base 2 is viewed in a plan view, the first regions 15 are arranged apart from one another at the corner portions of the base 2 and positions other than the corner portions of the base 2. More specifically, the first regions 15 are arranged to be spaced apart from one another at the four corner portions of the base 2 and in the vicinity of the centers of two long sides of the base 2, and the case 7 facing the side surface of the base 2 is divided in two and arranged with the first region 15 arranged in the vicinity of each center of two long sides interposed therebetween, in the long side direction of the base 2.

In the present embodiment, similarly to the first embodiment, the wide region (first region) 15 of the Al material 4 is provided such that the difference (L1-L2) between L1 and L2, that is, the x-direction length of the wide region (first region) 15 of the Al material 4 is larger than the plate thickness of the base 2. In addition, the position of the adhesion end portion 13 is defined such that L3 is equal to or larger than L2 (L3 L2).

Herein, as described above, a case where the temperature of the semiconductor module 1 changes from a high temperature to a low temperature is considered. First, it is considered that the stress generated on the side surface of the base 2 in the vicinity of the first region 15 at the corner portion of the base 2 is larger than the stress generated on the side surface of the base 2 in the vicinity of the first region 15 arranged at the center portion of the base 2 in the longitudinal direction. This is because a distance from the central portion of the module is long, and the influence of the thermal contraction of the case 7 is large.

Therefore, as illustrated in FIG. 10, even in a case where the first region 15 is present in a portion other than the corner portion of the base 2, it is sufficient if the stress generated in the vicinity of the corner portion of the base 2 is evaluated. The contents related to the mechanism of stress generation and verification of the stress suppression effect in the present embodiment are the same as the contents described in the first embodiment.

In the present embodiment, the number of the wide regions (first regions) 15 of the Al material 4 is set to six, but even in a case where the number is larger than six, a similar dimensional relationship and an effect relationship thereof are established.

Fourth Embodiment

Figure 11:
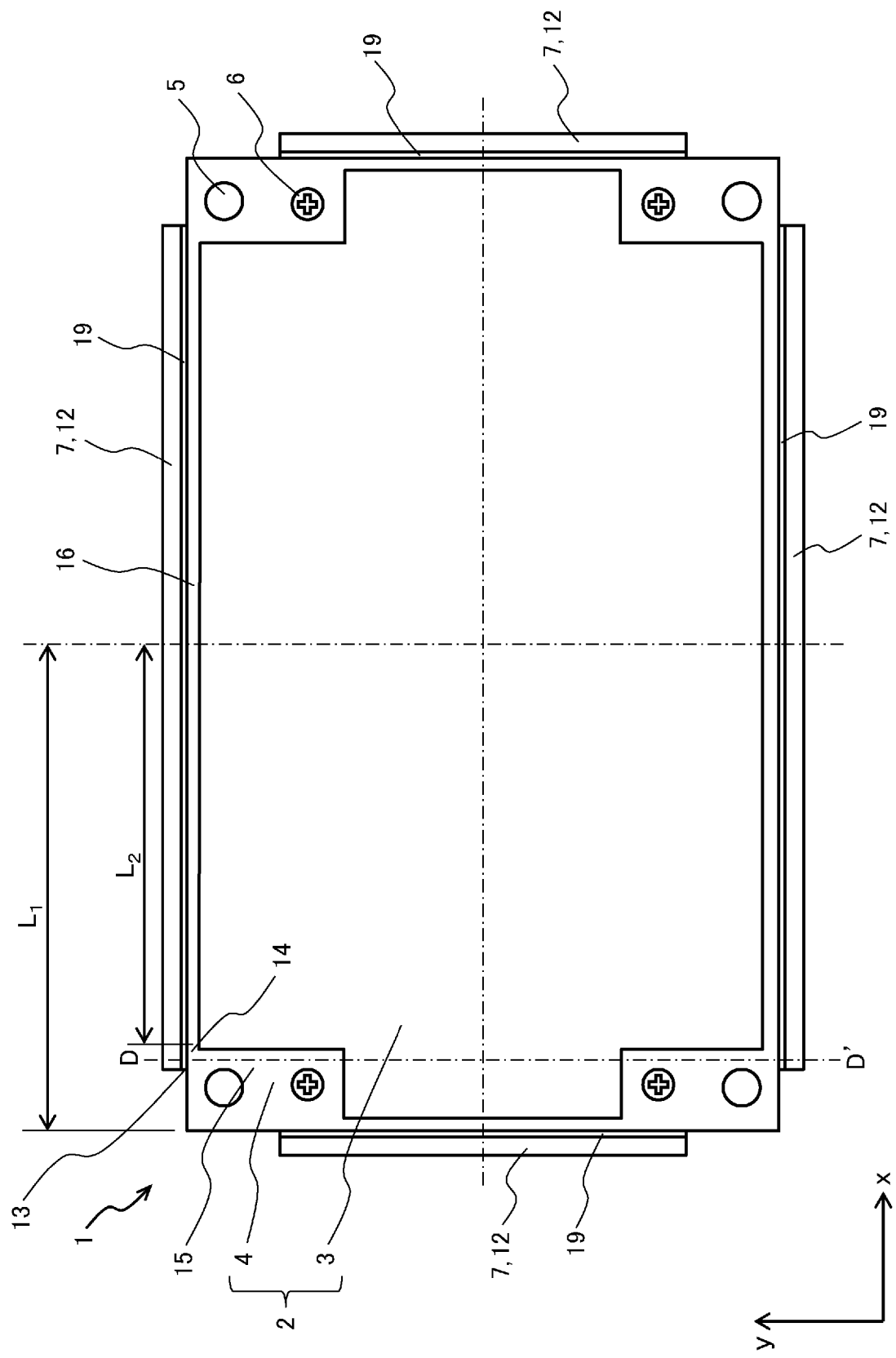
FIG. 11 is a bottom view of a semiconductor module according to a fourth embodiment of the present invention.
Figure 12:
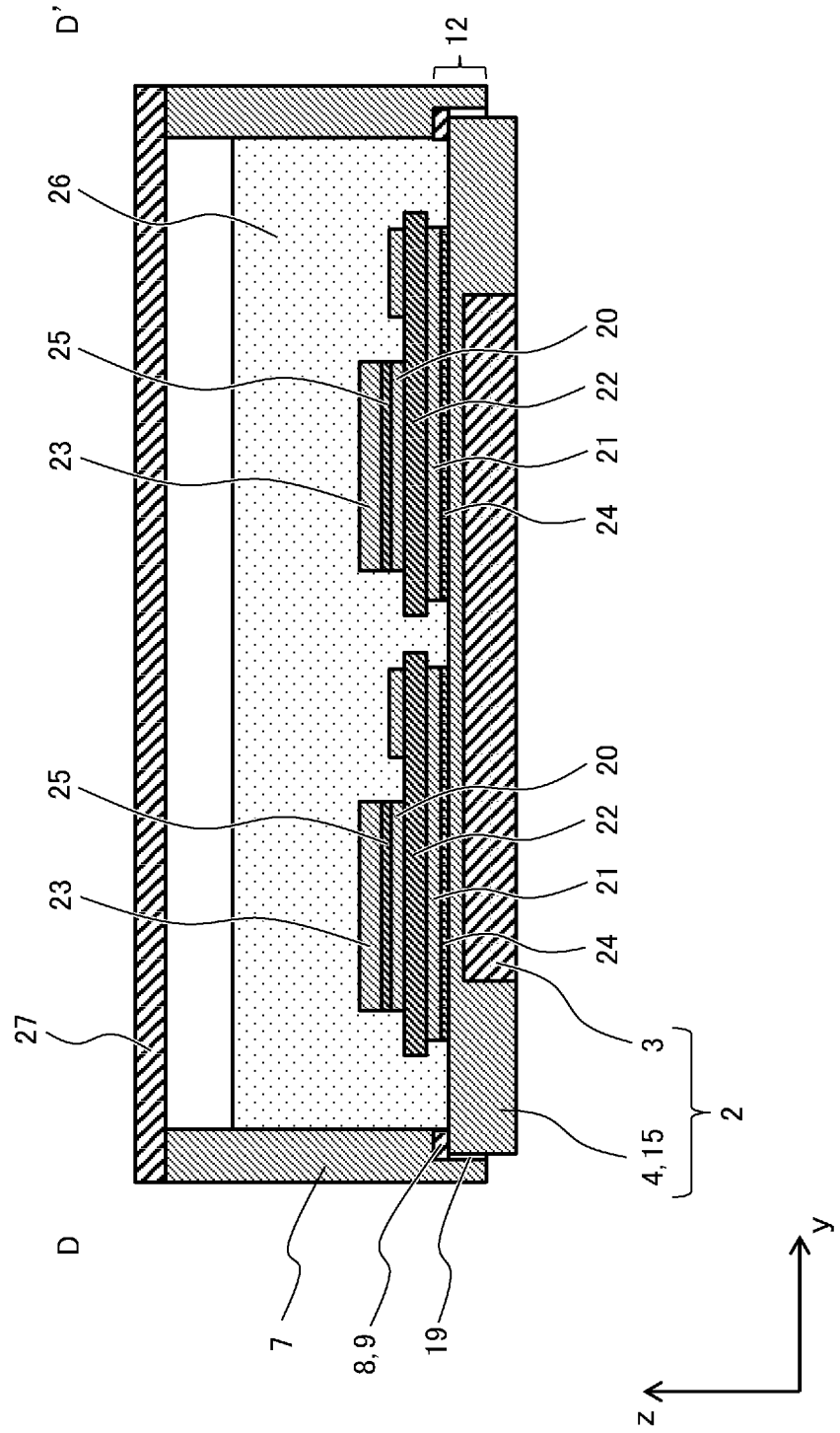
FIG. 12 is a cross-sectional view taken along line D-D' of FIG. 11.

A semiconductor module according to a fourth embodiment of the present invention will be described with reference to FIGS. 11 and 12. FIG. 11 is a bottom view of the semiconductor module of the present embodiment, and FIG. 12 is a cross-sectional view taken along line D-D' of FIG. 11. FIGS. 11 and 12 correspond to FIGS. 4 and 5 of the first embodiment, respectively.

A basic configuration of the present embodiment is similar to that of the first embodiment, and points different from the first embodiment will be mainly described.

In the first embodiment (FIGS. 4 and 5), the case 7 adheres to the upper surface and the side surface of the base 2 by the adhesive material upper surface portion 9 and the adhesive material side surface portion 10 of the adhesive material 8, whereas the semiconductor module 1 of the present embodiment is different from the first embodiment (FIGS. 4 and 5) in that a gap 19 is provided between the side surface of the base 2 and the case 7 without interposing the adhesive material 8, and the case 7 adheres to the upper surface of the base 2 by the adhesive material upper surface portion 9 of the adhesive material 8.

That is, in the present embodiment, as described in the first to third embodiments, the length (L3) from the center of the side of the base 2 to the end portion of the adhesive material 8 which adheres the base 2 and the case 7 on the side surface of the base 2 is 0 (L3=0).

As in the present embodiment, by adhering the case 7 to the upper surface of the base 2 only with the adhesive material upper surface portion 9 without interposing the adhesive material 8 on the side surface of the base 2, a bonding strength between the base 2 and the case 7 is reduced as compared with other embodiments, but the stress generated in the base 2 (the AlSiC material 3 and the Al material 4) can be more reliably suppressed.

FIGS. 11 and 12 illustrate an example in which the adhesive material 8 is not interposed on the four side surfaces in the long side direction (x direction) and the short side direction (y direction) of the base 2, but it is also possible to interpose the adhesive material 8 on any one of the long side direction (x direction) and the short side direction (y direction) of the base 2 and not to interpose the adhesive material 8 on the other. In this case, since the stress due to the side surface adhesion tends to be larger in the long side direction of the base 2, it is desirable to interpose the adhesive material 8 only in the short side direction.

In the first to fourth embodiments described above, the relationship between the dimensions of the base 2, the case 7, and the adhesion portion, and the effects thereof have been described for the adhesion region on the long side (the x direction side in FIG. 1) of the semiconductor module 1. However, a similar dimensional relationship and an effect relationship thereof are also established on the short side (the y direction side in FIG. 1) of the semiconductor module 1.

Therefore, for example, the short side (y-direction side) of the base 2 may satisfy $L3 \geq L2$ as described in the first embodiment, and the long side (x-direction side) of the base 2 may satisfy $L2 - L3 \geq L1 - L2$ as described in the second embodiment.

Note that the present invention is not limited to the above-described embodiments, and various modifications are included. For example, the above-described embodiments have been described in detail for easy understanding of the invention and are not necessarily limited to those having all the configurations. In addition, a part of the configuration of a certain embodiment can be replaced with the configuration of another embodiment, and the configuration of another embodiment can be added to the configuration of a certain embodiment. It is possible to add, delete, and replace other configurations for a part of the configuration of each embodiment.

REFERENCE SIGNS LIST 1 semiconductor module
2 base
3 AlSiC material
4 Al material
5 fixing pit
6 fixing screw
7 case
8 adhesive material
9 adhesive material upper surface portion
10 adhesive material side surface portion
12 case protruding portion
13 adhesion end portion
14 boundary between region 15 and region 16
15 wide region (first region) of Al material 4
16 narrow region (second region) of Al material 4
17 rounded portion on side surface of base 2
18 rounded portion on side surface of base 2
19 gap
20 circuit wiring pattern
21 lower surface conductor layer
22 insulation substrate
23 semiconductor chip
24 substrate bonding solder
25 chip bonding solder
26 silicone Gel
27 lid
GS generated stress (relative value)

The invention claimed is:

1. A semiconductor module comprising:
a base;
an insulation substrate bonded to the base;
a semiconductor chip bonded to the insulation substrate; and
a case adhering to the base with an adhesive material, wherein
the base includes a plate-shaped first material and a second material covering the first material and having a linear expansion coefficient larger than a linear expansion coefficient of the first material,
in a case where the base is viewed in a plan view, the second material has first regions arranged at corner portions of the base and a second region arranged at an outer peripheral portion of the base and having a width narrower than a width of each of the first regions,
the case covers at least a part of a side surface of the base and adheres to the base, with the adhesive material, at least on an upper surface of the base, and a linear expansion coefficient of the case is larger than the linear expansion coefficient of the first material,
when a length from a center of a side of the base to an end portion of the base is L1, and a length from the center of the side of the base to a boundary between the first region and the second region is L2, $L1-L2$ is larger than a plate thickness of the base, and
$L3 \geq L2$ or $L2-L3 \geq L1-L2$ is satisfied in a case where a length from the center of the side of the base to an end portion on a corner portion side of the base of the adhesive material which adheres the case to the base on the side surface of the base is L3, and L3=0 in a case where there is no adhesive material on the side surface of the base.

2. The semiconductor module according to claim 1, wherein
a short side of the base satisfies $L3 \geq L2$, and
a long side of the base satisfies $L2-L3 \geq L1-L2$.

3. The semiconductor module according to claim 1, wherein
the first material is AlSiC, and
the second material is Al.

4. The semiconductor module according to claim 1, wherein
a length from the center of the side of the base to an end portion of the case facing the side surface of the base is the same as L3.

5. The semiconductor module according to claim 1, wherein
in the case where the base is viewed in a plan view, the first regions are arranged apart from one another at the corner portions of the base and a position other than the corner portions of the base.

6. The semiconductor module according to claim 5, wherein
the first regions are arranged to be spaced apart from one another at four corner portions of the base and in vicinity of centers of two long sides of the base, and the case facing the side surface of the base is divided into two and arranged with the first region arranged in vicinity of each center of the two long sides interposed therebetween, in a long side direction of the base.

7. The semiconductor module according to claim 1, wherein the L3=0, and there is no adhesive material between the base and the case on the side surface of the base, and the case adheres to the base, with the adhesive material, on the upper surface of the base.

8. The semiconductor module according to claim 1, wherein the case has a protruding portion facing a side surface of the base with the adhesive material interposed therebetween, and the protruding portion is provided to cover at least a part of the side surface of the base.

9. The semiconductor module according to claim 3, wherein a material of the case is PBT or PPS.

10. The semiconductor module according to claim 1, wherein the semiconductor chip is a semiconductor chip on which an IGBT is mounted.

\* \* \* \* \*